(12) United States Patent
Edwards

(10) Patent No.: US 10,612,992 B2
(45) Date of Patent: Apr. 7, 2020

(54) STRAIN GAUGE DETECTION AND ORIENTATION SYSTEM

(71) Applicant: Lockheed Martin Corporation, Bethesda, MD (US)

(72) Inventor: George N. Edwards, Marietta, GA (US)

(73) Assignee: Lockheed Martin Corporation, Bethesda, MD (US)

( * ) Notice: Subject to any disclaimer, the term of this patent is extended or adjusted under 35 U.S.C. 154(b) by 231 days.

(21) Appl. No.: 15/803,025

(22) Filed: Nov. 3, 2017

(65) Prior Publication Data
US 2019/0137352 A1    May 9, 2019

(51) Int. Cl.
| | |
|---|---|
| *G01L 25/00* | (2006.01) |
| *G01N 27/02* | (2006.01) |
| *G01R 31/28* | (2006.01) |
| *G01R 31/302* | (2006.01) |
| *G01R 31/315* | (2006.01) |

(52) U.S. Cl.
CPC ............ *G01L 25/00* (2013.01); *G01N 27/023* (2013.01); *G01R 31/2813* (2013.01); *G01R 31/302* (2013.01); *G01R 31/315* (2013.01)

(58) Field of Classification Search
CPC . G01R 31/2813; G01R 31/302; G01R 31/315
See application file for complete search history.

(56) References Cited

U.S. PATENT DOCUMENTS

| | | | | |
|---|---|---|---|---|
| 2,447,517 | A |   | 8/1948 | Manson |
| 3,619,805 | A | * | 11/1971 | Bean ..................... G01B 7/023 331/65 |
| 3,840,802 | A | * | 10/1974 | Anthony ............ G01N 27/9033 324/219 |
| 4,445,085 | A | * | 4/1984 | Metcalf ................ G01R 31/088 324/524 |
| 4,796,259 | A | * | 1/1989 | Troy ................... G06F 11/2273 324/73.1 |

(Continued)

FOREIGN PATENT DOCUMENTS

| | | | | |
|---|---|---|---|---|
| DE | 2817930 A1 | * | 10/1979 | ............... H04B 3/46 |
| DE | 3729500 A1 | * | 3/1989 | ........... G01R 31/315 |

(Continued)

*Primary Examiner* — David A Rogers
(74) *Attorney, Agent, or Firm* — Baker Botts L.L.P.

(57) ABSTRACT

A system includes a signal generator configured to generate a signal, the signal being a constant frequency signal or the signal ranging in frequency during a time period. The system includes a probe electrically coupled to the signal generator, and the probe is configured to hover across or touch an encapsulated or uncapsulated strain gauge. The probe includes a coil and a stylus. The coil is configured to receive the signal from the signal generator and generate a magnetic field. The stylus is configured to transmit the magnetic field to the strain gauge. The system includes a data acquisition component coupled to the strain gauge. The data acquisition component is configured to receive stimulus data from the strain gauge, resulting from the magnetic field transmitted by the probe. The data acquisition component is configured to determine whether the stimulus data from the strain gauge is above a threshold, and if so, determine that the strain gauge is operable.

19 Claims, 6 Drawing Sheets

(56) References Cited

U.S. PATENT DOCUMENTS

| | | | |
|---|---|---|---|
| 4,845,435 A | | 7/1989 | Bohan, Jr. |
| 5,003,254 A | * | 3/1991 | Hunt ........................ G01R 1/04 |
| | | | 269/903 |
| 5,578,930 A | | 11/1996 | Sheen |
| 5,734,269 A | | 3/1998 | Sakai et al. |
| 6,331,782 B1 | | 12/2001 | White et al. |
| 6,762,603 B2 | * | 7/2004 | Davies ................... G01B 7/105 |
| | | | 324/225 |
| 7,135,867 B2 | | 11/2006 | Pang et al. |
| 7,710,131 B1 | * | 5/2010 | Tiernan ................ G01R 31/302 |
| | | | 324/529 |
| 8,648,614 B2 | * | 2/2014 | Kuroda ................ G01R 31/315 |
| | | | 324/754.01 |
| 8,847,617 B2 | | 9/2014 | Nickel et al. |
| 2003/0001596 A1 | * | 1/2003 | Suga ................... G01R 31/315 |
| | | | 324/754.29 |
| 2008/0258744 A1 | * | 10/2008 | Kuroda ............. G01R 31/3025 |
| | | | 324/755.01 |
| 2009/0066592 A1 | * | 3/2009 | Dokai ..................... G01R 1/07 |
| | | | 343/703 |
| 2011/0018524 A1 | | 1/2011 | Fitzsimmons |
| 2013/0200909 A1 | | 8/2013 | Rasbornig et al. |
| 2016/0146886 A1 | | 5/2016 | Finkenzeller et al. |

FOREIGN PATENT DOCUMENTS

| | | | | |
|---|---|---|---|---|
| JP | 02002967 | | 1/1990 | |
| JP | 2010112713 A | * | 5/2010 | |
| JP | 2012047636 A | * | 3/2012 | |
| WO | WO-8602456 A1 | * | 4/1986 | ............ G01N 27/82 |
| WO | 2015078448 | | 6/2015 | |

\* cited by examiner

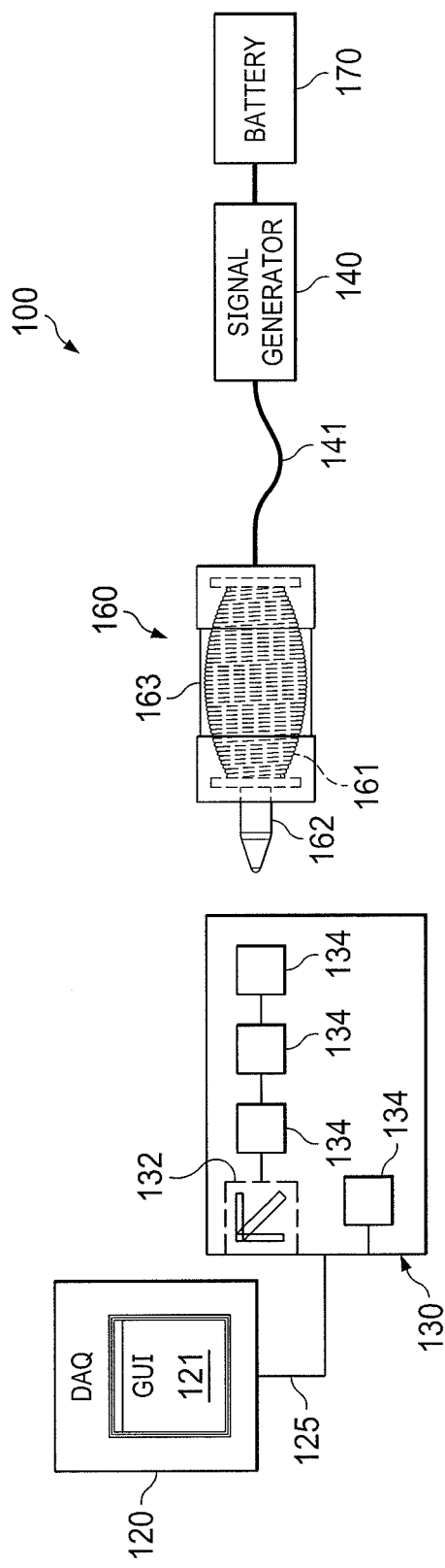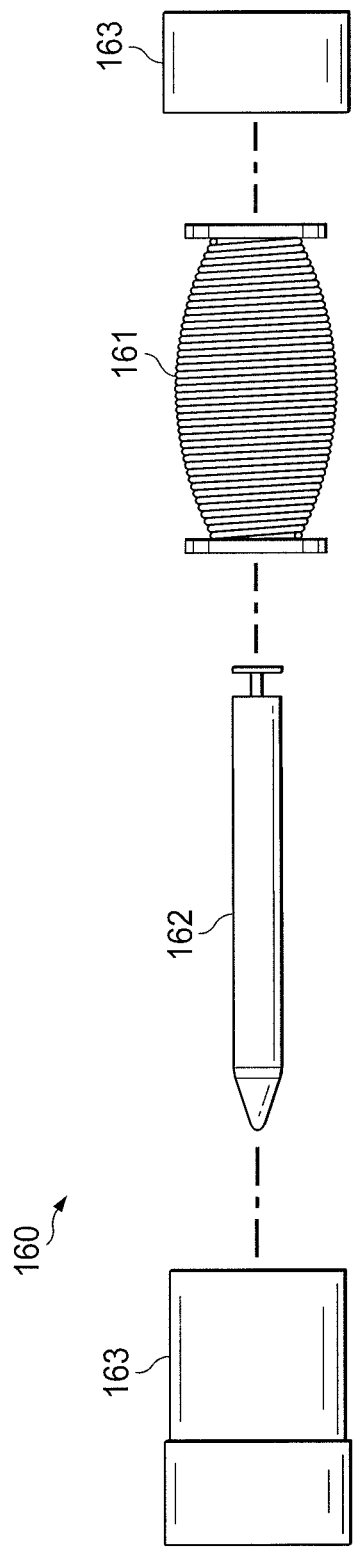

STRAIN GAUGE DETECTION AND ORIENTATION SYSTEM

TECHNICAL FIELD

The present disclosure relates in general to sensors for data acquisition systems, and more specifically to a strain gauge detection and orientation system.

BACKGROUND

When developing new structures (e.g., part of an aircraft), testing and data acquisition takes place to ensure that the structure and material are strong enough to withstand certain forces. During this structural testing, strain gauges may be applied to the structure and used to measure elongations of materials. Before performing any testing, the strain gauges are typically checked to ensure they are wired correctly. Current techniques and tools for detecting strain gauges may be limited.

SUMMARY OF THE DISCLOSURE

According to one embodiment, a system comprises a signal generator configured to generate a signal, the signal ranging in frequency during a time period. The system further includes a probe electrically coupled to the signal generator, and the probe is configured to hover across or touch a strain gauge. The probe comprises a coil and a stylus coupled to the coil. The coil is configured to receive the signal from the signal generator and, based on the signal, generate a magnetic field. The stylus is configured to transmit the magnetic field to the strain gauge. The system further comprises a data acquisition component coupled to the strain gauge. The data acquisition component is configured to receive stimulus data from the strain gauge, where the stimulus data from the strain gauge results from the magnetic field transmitted by the probe. The data acquisition component is further configured to determine whether the stimulus data from the strain gauge is above a threshold, and in response to determining that the stimulus data from the strain gauge is above the threshold, determine that the strain gauge is operable.

According to one embodiment, a method comprises electrically coupling a signal generator to a probe, where the probe comprises a coil and a stylus. The method further comprises generating a signal by the signal generator, the signal ranging in frequency during a time period. The method further comprises receiving the signal at the coil of the probe, hovering the probe across the strain gauge, and transmitting, by the stylus of the probe, the magnetic field to the strain gauge. The method further comprises receiving stimulus data from the strain gauge at a data acquisition component, where the stimulus data from the strain gauge results from the magnetic field transmitted by the probe. The method finally comprises determining whether the stimulus data from the strain gauge is above a threshold, and in response to determining the stimulus data from the strain gauge is above a threshold, determining that the strain gauge is operable.

According to one embodiment, a system comprises a housing structure configured to house a signal generator and a battery. The signal generator is configured to generate a signal, where the signal ranges in frequency during a time period. The battery is electrically coupled to the signal generator and is configured to provide power to the signal generator. The system further comprises a probe electrically coupled to the signal generator, and the probe configured to hover across a strain gauge. The probe comprises a coil and a stylus. The coil is configured to receive the signal from the signal generator and, based on the signal, generate a magnetic field. The stylus is coupled to the coil, and is configured to transmit the magnetic field to the strain gauge.

Technical advantages of certain embodiments may include a noninvasive, quick, and efficient way of exciting strain gauges electrically rather than manually to detect strain gauges and their orientations, thus saving computational resources and time compared to manually exciting and testing each individual strain gauge. Further advantages include reducing the likelihood that a strain gauge is not properly tested, due to being unable to visually confirm the location of the strain gauge. Other technical advantages will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the disclosed embodiments and their features and advantages, reference is now made to the following description, taken in conjunction with the accompanying drawings, in which:

FIGS. 1A, 1B, and 1C illustrate a system for strain gauge detection and orientation, according to certain embodiments;

DETAILED DESCRIPTION

Figure 1C:
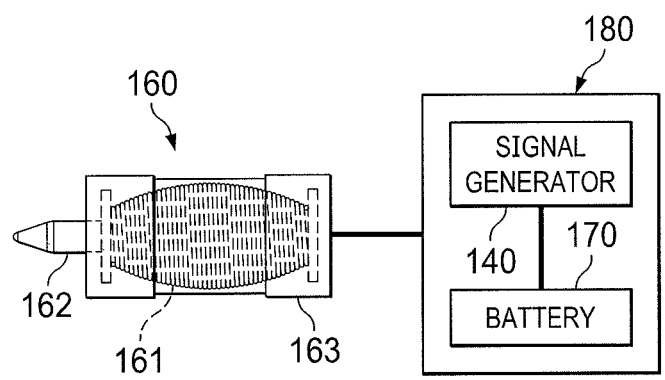

When structures are tested with strain gauges, a variable number of strain gauges are needed, ranging from a few to several thousand depending on the size and intricacy of the structure. Before performing any testing, the strain gauges must be checked to ensure they are wired correctly, otherwise the testing may lead to inaccurate data regarding the strength of the structure and elongation of material. Also, a gauge's orientation is typically checked to ensure the correct data will be obtained. If a gauge is wired incorrectly, oriented incorrectly, patched incorrectly, wired to the wrong input to a data acquisition component, and/or if the gauge has failed, incorrect and inaccurate data may be received from the test. This may require additional testing, which wastes resources. Thus, before any testing occurs, strain gauges are applied to the structure, wired, and connected to the system, and further, during the check the strain gauges need to be verified as functional and have their orientations confirmed.

The process of checking strain gauges, known as end-to-end wiring checks, often requires manual checks of each strain gauge. For example, a technician may physically press on the strain gauge, and another technician may monitor the data acquisition component screen to see whether it registered the stimulus on the strain gauge (e.g., amplitude shown on the screen). Difficulty may arise depending on the location of the strain gauge. For example, a strain gauge may be covered (e.g., encapsulated) and difficult to see in order to activate (e.g., covered with sealant or conformal coating). As another example, the material covering the strain gauge and/or the material on which the strain gauge is mounted (e.g., the material being tested) may be strong, and thus a technician may not have enough physical strength to simply press the strain gauge. This may result in the strain gauge not registering any force and/or showing any amplitude on a screen of a data acquisition component. Because of the number of strain gauges used, the potential difficulty to access each strain gauge, and the material stiffness, these checks often take a significant amount of time and effort to perform.

Thus, it may be desirable to have a noninvasive, efficient tool to check strain gauge liveness and orientation of a large number of strain gauges. The teachings of this disclosure recognize that the use of a probe that performs inductive coupling to induce a small signal into the strain gauge grid may cause displacement in the strain gauge readings on the connected data acquisition component. By passing over each gauge with the probe and creating this inductive signal to test the strain gauges, the probe is non-invasive, requires less time to check, and is more efficient than a technician manually pressing on each gauge. Further, this field is able to pass through any conformal gauge coatings, thus reducing or eliminating the likelihood that a gauge is missed (e.g., not checked) because it was unable to be seen or physically pressed. The probe may also check the orientation of the biaxial or triaxial gauge, thus ensuring that the correct data is received for the structure being tested.

FIGS. 1A and 1B illustrate a system 100 for strain gauge detection and orientation, according to certain embodiments. System 100 includes a battery 170, a signal generator 140, a probe 160, a structure 130, strain gauges 132 and 134, wires 125 and 141, and a data acquisition component 120. FIG. 1B illustrates an exploded view of an embodiment of probe 160. Probe 160 includes a coil 161 and stylus 162.

In general, system 100 involves probe 160 that is utilized to detect whether strain gauges 132 and 134 are wired and patched correctly. Specifically, probe 160 receives signals from the signal generator 140 and creates a magnetic field that is received by the strain gauges 132 and 134 as probe 160 hovers over the strain gauges 132 and 134. Strain gauges 132 and 134 register this induction signal and send it to data acquisition component 120, which can confirm that strain gauges 132 and 134 are wired correctly and with the correct orientation. In this way, system 100 provides a non-invasive and efficient way to excite strain gauges 132 and 134, and thus test whether they are wired correctly, without taking the time and risk of attempting to excite each strain gauge 132 and 134 mechanically. Further, mechanically exciting each strain gauge would provide no feedback on whether a biaxial or triaxial strain gauge is correctly oriented.

Structure 130 may be any component, device, model, or configuration that is or needs to be tested. For example, structure 130 may be a beam, pressure vessel, bridge, train, airplane wing, any part of an aircraft, or any structure that needs to be tested. Structure 130 may be tested to determine how it responds under certain pressures or force. In some embodiments, structure 130 may be tested by using strain gauges 132 and 134.

Strain gauges 132 and 134, in some embodiments, are devices used to measure the strain on structure 130. When structure 130 is being tested (e.g., a force is applied to structure 130), strain gauges measure and capture data regarding how structure 130, and the materials it is made out of, react to certain forces. Any number of strain gauges 132 and 134 may be applied to structure 130. Strain gauges 132 and 134 may be wired such that data acquisition component 120 receives the strain data from each individual strain gauge 132 and 134. In some embodiments, strain gauges 132 and 134 may be a single element, or axial strain gauge. An axial strain gauge (e.g., strain gauge 134), is not coupled to or stacked on any other strain gauge and may measure the strain in a single direction. For axial strain gauge 134, it is beneficial to determine whether the strain gauge is accurately receiving data, for example, by exciting strain gauge 134 to determine if data acquisition component 120 registers that excitement on strain gauge 134. In some embodiments, strain gauges 132 and 134 may include multiple legs of strain gauges (e.g., stacked or separated) to measure strain in different directions. For example, a rosette strain gauge (e.g., strain gauge 132) may include three legs of strain gauges (e.g. triaxial gauge), each measuring the strain in a different direction. As another example, system 100 may include biaxial strain gauges that includes two legs to measure strain in two different directions (e.g., the legs are perpendicular to each other). In rosette strain gauge 132 (e.g., biaxial and/or triaxial), it may be beneficial to test whether it is accurately receiving data, for example by exciting strain gauge 132 to see if data acquisition component 120 registers that excitement on strain gauge 132. In rosette strain gauge 132 it may also be beneficial to test the orientation of the legs of the strain gauges to ensure that they are wired correctly. This is beneficial because it reduces the likelihood that data acquisition component 120 will receive improper test information.

Data acquisition component 120, in some embodiments, captures data measured by strain gauges 132 and 134. Data acquisition component 120 is coupled (e.g., by wire or cable) to each strain gauge 132 and 134. It may be beneficial to test the wiring and orientation of strain gauges 132 and 134 to determine whether they are properly coupled to data acquisition component 120 such that it will receive accurate strain measurements. In some embodiments, data acquisition component 120 includes a graphical user interface (GUI) 121. GUI 121 may display data that is captured by data acquisition component 120. In some embodiments, GUI 121 may display data in real time to show the strain on structure 130 being measured by strain gauges 132 and 134. In some embodiments, GUI 121 may be a tabular display, showing the number of strain data captured, and/or graphical display, showing graphs of the strain data captured. GUI 121 allows for an engineer or tester to see strain gauge data and determine how structure 130 performed during the testing. In some embodiments, data acquisition component 120 may allow certain thresholds to be set. For example, data acquisition component 120 may receive a measurement from strain gauge 132 and determine whether the received measurement is above or below a threshold (e.g., amount of microstrain).

In some embodiments, signal generator 140 provides one or more signals to system 100. In some embodiments, signal generator 140 provides the one or more signals to probe 160 via connector or cable 141. Signal generator 140 may rely on battery 170 to provide the electricity required to generate the signals. In some embodiments, signal generator 140 is a sweep generator that modulates the frequency of the signal (e.g., varying from 1 kilohertz to 5 kilohertz, depending on structure material and grid geometry) and sweeps over that range for a time period (e.g., 1 second, 3 seconds, etc.). Some strain gauges 132 and 134 may respond better to a certain frequency over another. So by varying the frequency of the signal that is provided to strain gauges 132 and 134, the likelihood that each strain gauge 132 and 134 receives a signal to which it responds well may be increased. This further increases the likelihood that the data received by data acquisition component 120 from strain gauges 132 and 134 is accurate and complete. In some embodiments, signal generator 140 may have the ability to vary the amplitude output, and the amplitude may be set such that signal generator 140 has a 10V drive.

In some embodiments, probe 160 is a device that induces a signal to strain gauges 132 and 134, which facilitates system 100 ensuring that they are wired correctly. Probe 160 may be coupled to signal generator 140 such that probe 160 generates signals at different frequencies (e.g., the signal sweeps across multiple frequencies in a period of time). To facilitate inducing a signal to strain gauges 132 and/or 134, probe 160 may include coil 161 and stylus 162. In some embodiments, coil 161 and stylus 162 may be enclosed by a probe structure 163 that surrounds coil 161 and at least part of stylus 162. Probe structure 163 is made of a non-magnetic material suitable to keep coil 161 and stylus 162 protected from elements and/or impact that may affect them. For example, probe structure 163 may be made of three separate pieces of plastic that fit together to create probe structure 163.

Coil 161 is included within probe 160, in some embodiments. Coil 161 may include a wire bound in several hundred turns around a hole in the center. For example, the wire may be a 0.008" diameter magnet wire with a 150 ohm resistance that is bound around a hole in the center such that the wire has a number of turns. Coil 161 may receive one or more signals from signal generator 140, which facilitates coil 161 generating a magnetic field.

Stylus 162 is included within probe 160, in some embodiments. Stylus 162 may be coupled to coil 161. For example, stylus 162 may include a compact metal rod that may be inserted within the hole in the center of coil 161, such that coil 161 surrounds at least part of stylus 162. In some embodiments, stylus 162 is configured to transmit the magnetic field from coil 161 to strain gauges 132 and 134. The magnetic field generates a voltage into the grid of strain gauges 132 and 134 that appear to be strain-induced. Thus strain gauges 132 and 134 may register strain even though no pressure or force is being applied to structure 130. In some embodiments, a portion of stylus 162 may be outside of coil 161 such that the portion of stylus 162 creates a tip of probe 160. In some embodiments, a portion of stylus 162 may also be outside the boundaries of probe structure 163. The magnetic field created by coil 161 may emanate out of the tip of stylus 162, such that the field is concentrated. Probe structure 163 may prevent the field from emanating directly out of coil 161, and instead forces it to emanate out of the tip of stylus 162. In some embodiments, this tip of stylus 162 may be covered with a coating (e.g., acrylic coating) to prevent it from being a fouling or damaging mechanism to strain gauges 132 and 134. Further, in some embodiments, the tip of stylus 162 may be short, small, and not physically imposing (e.g., approximately 1-3 inches long), so that it is able to reach into tight spaces. For example, if structure 130 has areas that are hard to reach, the tip of stylus 162 can be inserted in the small space such that any strain gauges 132 and 134 in the tight space may still be tested.

In some embodiments, a housing structure 180 may enclose signal generator 140 and battery 170 into one unit, and probe 160 is separated from housing structure 180 with a wire or cable connecting housing structure 180 and probe 160 as shown in FIG. 1C. Signal generator 140 may be a compact and portable device such that it may be housed in housing structure 180. This may enable probe 160 to access difficult to reach and/or tiny spaces, while still allowing the whole system to be very portable for transporting to any testing facility or site, without requiring a plug or other source of electricity.

In operation, system 100 tests whether strain gauges 132 and 134 are operable and correctly wired before testing structure 130. Probe 160 hovers across one strain gauge (e.g., 134), while emitting a magnetic field created by the signal received from signal generator 140. In some embodiments, hovering entails touching or contacting the material covering strain gauges 132 and the moving across the material while emitting a magnetic field. By hovering, probe 160 does not directly contact with the grid of strain gauge 132, but instead directly contacts the material covering strain gauge 132. Strain gauge 132 receives that magnetic field as a voltage, and registers the voltage as strain. Strain gauge 132 provides that strain measurement to data acquisition component 120. Data acquisition component 120 may determine whether the received measurement is above a threshold, and if so, determines that strain gauge 132 has been detected. If strain gauge 132 has been detected, then it is determined that it is wired correctly. System 100 may repeat this process for each strain gauge until all are registered as being wired correctly. This provides a non-invasive, quick, and inexpensive way to ensure strain gauges 132 and 134 are wired correctly before performing tests on structure 130.

Modifications, additions, or omissions may be made to the systems described herein without departing from the scope of the invention. For example, system 100 may include any number of batteries 170, signal generators 140, probes 160, structures 130, strain gauges 132 and 134, and data acquisition components 120. As another example, probe 160, signal generator 140, and battery 170 may be integrated in a portable housing structure 180 to allow for a more compact way to test strain gauges 132 and 134. The components may be integrated or separated. Moreover, the operations may be performed by more, fewer, or other components.

Figure 2A:
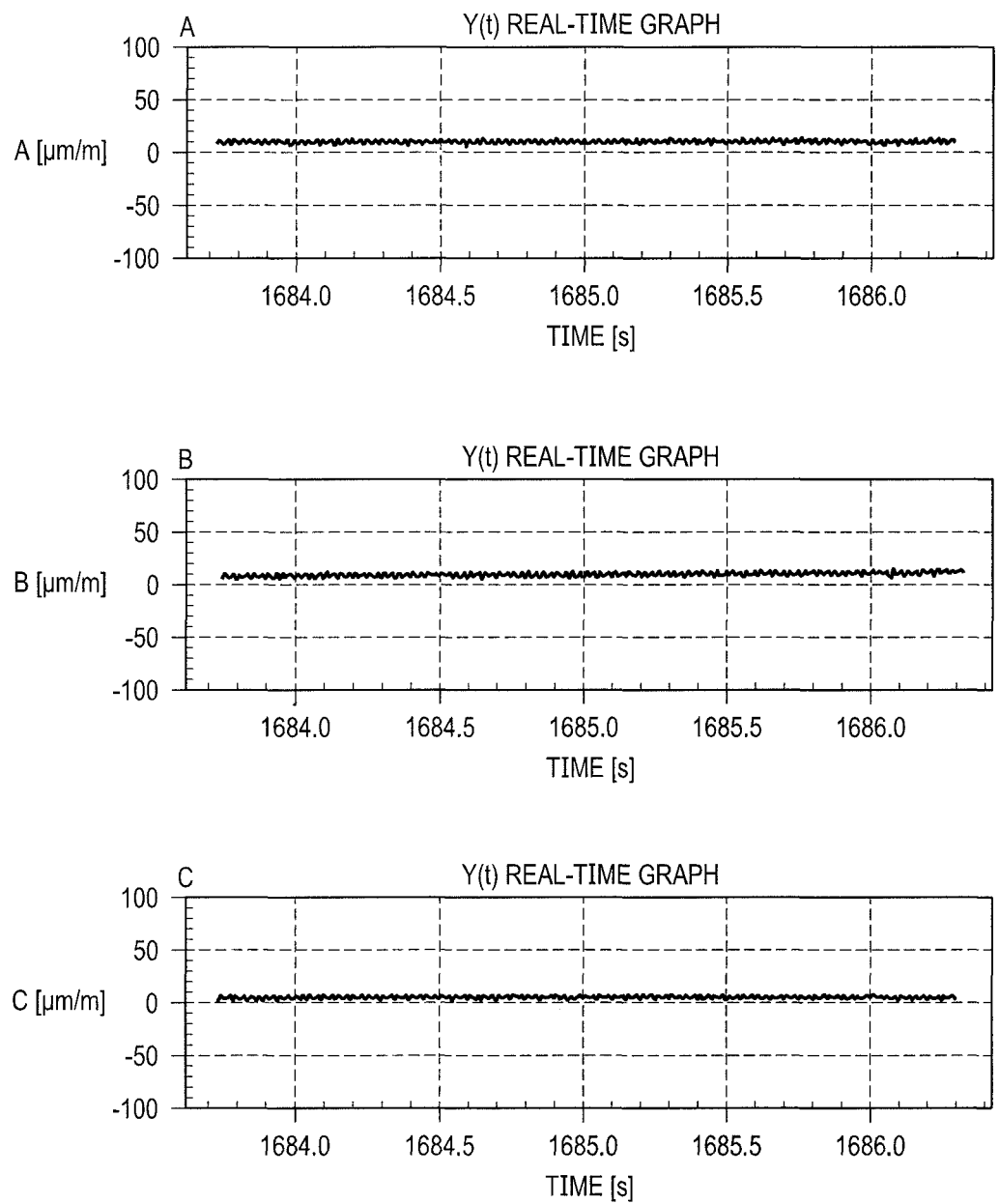
FIGS. 2A, 2B, and 2C illustrate a display from a data acquisition component when using an example embodiment of the system of FIG. 1.
Figure 2B:
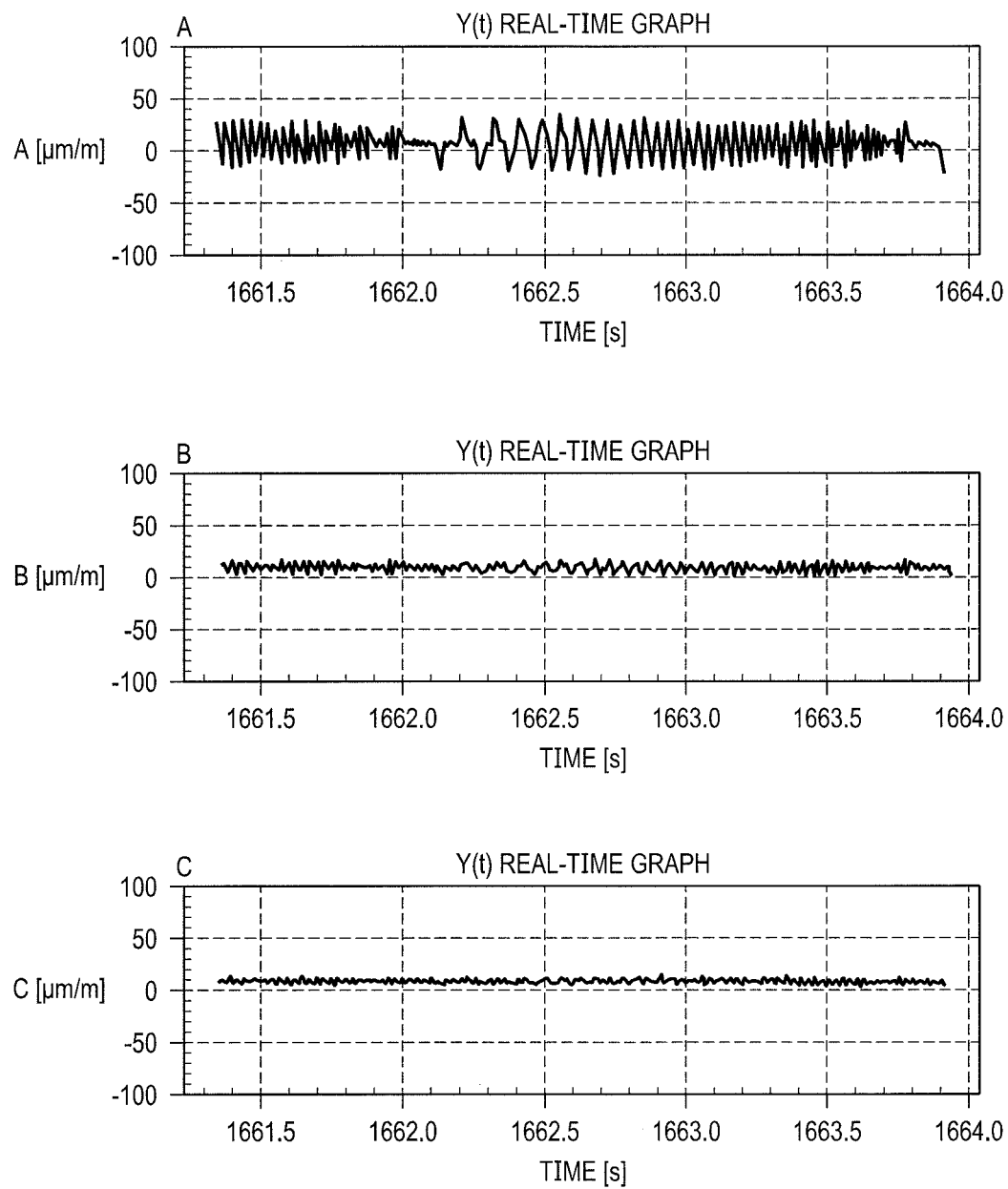
Figure 2C:
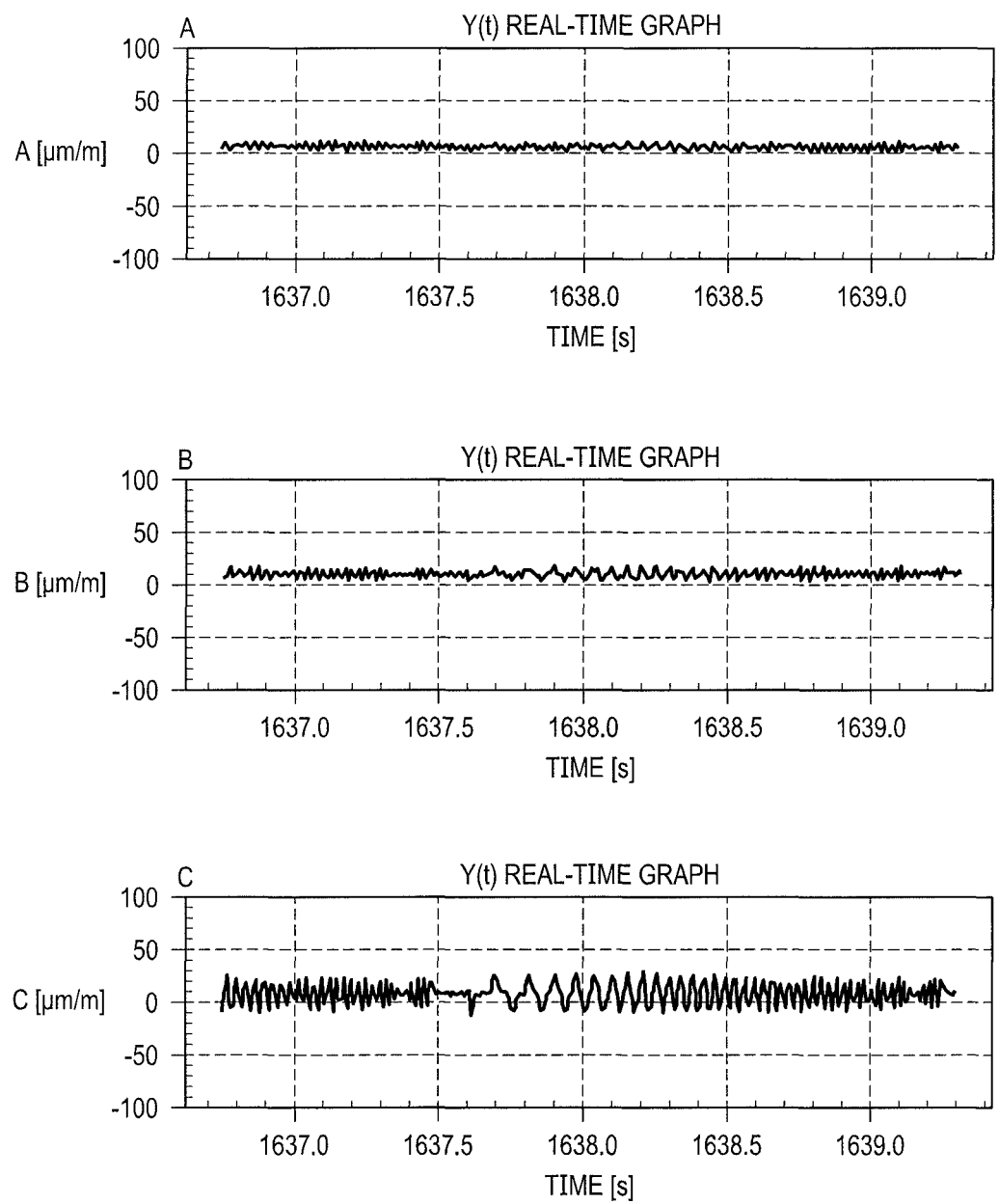

FIGS. 2A, 2B, and 2C illustrate a GUI 121 from data acquisition component 120 when using an example embodiment of system 100 of FIG. 1. In general, FIGS. 2A, 2B, and 2C illustrate the data captured by data acquisition component 120 to determine whether strain gauges are detected or not. Each graph indicates the strain on the Y axis and the time on the X axis. The amplitude of the strain measurement indicates whether strain gauge 134 has registered any strain, and the value. Each individual graph (labeled A, B, and C) indicates the three different legs of strain gauge 134 and the strain being measured on the legs at a point in time. FIG. 2A illustrates when probe 160 is not yet being used to hover over any part of strain gauge 134. Thus, none of the three legs of strain gauge 134 are detecting any strain during this time period.

FIG. 2B illustrates GUI 121 when probe 160 is hovering over leg A of strain gauge 134. Graph A of FIG. 2B illustrates a large amplitude, indicating that leg A of strain gauge 134 has registered some strain, for example, from probe 160 inducing a signal into the leg. System 100 may recognize that as probe 160 is hovering across leg A, the amplitude of strain in graph A should be above a certain threshold. If graph A registered the strain above a certain threshold, then system 100 determines that leg A is wired and patched correctly. In some embodiments, another leg (e.g., leg B) may register some strain due to probe 160 hovering over a leg nearby, as illustrated in Graph B of FIG. 2B. However, the amplitude of graph B is less than graph A, thus indicating that leg A is receiving the highest signal.

System 100 may compare the strain amplitude measured in graph B against a threshold and/or compare it to the amplitude measured in graph A to determine whether leg B is being tested. If, for example, probe 160 is hovering over leg C, and GUI 121 shows the graphs as illustrated in FIG. 2B, that would indicate that the orientation of leg C is incorrect. If probe 160 is hovering over leg C and there is no amplitude registered on graph C, then this indicates an issue with the orientation of the strain gauge. Thus, the orientation may be fixed before beginning the test of structure 130, thus reducing the likelihood of receiving incorrect data and conserving computational resources.

FIG. 2C illustrates display 121 when probe 160 is hovering over leg C of strain gauge 134. Graph C of FIG. 2C illustrates a large amplitude of strain, indicating that leg C of strain gauge 134 has registered some strain, for example, from probe 160 inducing a signal into the leg. System 100 may recognize that as probe 160 is hovering over leg C, the amplitude of strain in graph C should be above a certain threshold. If graph C registered the strain above a certain threshold, then it is determined that leg C is wired and patched correctly. Probe 160 may repeat the process of hovering over each leg of strain gauge 134, thus inducing a signal into strain gauge 134 that excites it and causes it to register strain, until all the legs of strain gauge 134 have been detected, verified as connected, and confirmed to be wired and patched correctly.

In some embodiments, system 100 may detect whether the legs are wired and patched correctly. Probe 160 may hover across leg A, leg B, and leg C in sequence, while system 100 checks whether the amplitude measured by graphs A, B, and C match the same sequence. For example, at the time that probe 160 hovers across leg A, system 100 will check to see if graph A has a strain measurement above a threshold. If it does, then leg A is confirmed to be wired and patched correctly. If it does not, then system 100 sends an alert that there is an issue with leg A and strain gauge 134. Continuing the example, after probe 160 hovers across leg A, it will hover across leg B, while system 100 monitors the strain over leg B to see if its strain measurement is above a threshold, and thus verifies whether it is wired and patched correctly. Finally, as probe 160 hovers across leg C, system 100 monitors graph C to ensure that leg C was properly registered. System 100 may coordinate the hovering of probe 160 with the monitoring and analysis of data to provide a check of the orientation of strain gauge 134.

Figure 3:
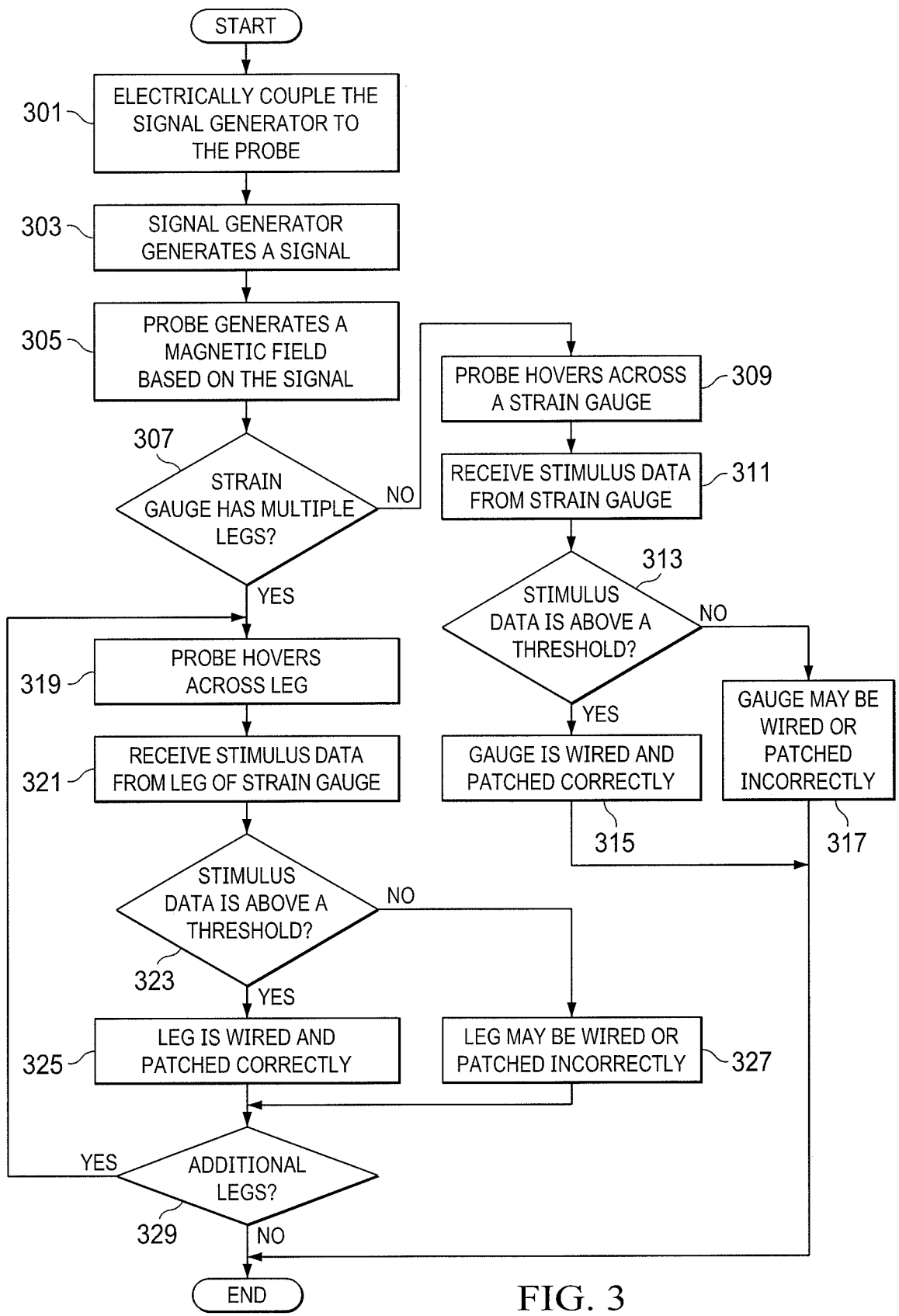
FIG. 3 is a flowchart illustrating a method for detecting and orienting strain gauges of FIG. 1, according to certain embodiments.

FIG. 3 is a flowchart illustrating a method 300 for detecting and orienting strain gauges 132 and 134 of FIG. 1, according to certain embodiments. Method 300 begins at step 301. At step 301, in some embodiments, signal generator 140 is electrically coupled to probe 160. Signal generator 140 may be coupled to probe 160 via a wire or a cable such that a signal from signal generator 140 may be delivered to probe 160. At step 303, in some embodiments, signal generator 140 generates a signal. In some embodiments, signal generator 140 may generator a signal at a constant frequency. In certain embodiments, the signal may range over a number of frequencies during a time period. In some embodiments, signal generator 140 may be a sweep generator such that the signal it generates varies over a range of frequencies for a period of time. For example, it may generate a signal sweeping across the frequency range of 1 kilohertz to 5 kilohertz over a period of a few seconds. By ranging the frequencies, it increases the likelihood that strain gauges 132 and 134 receive the signal at a frequency that they will register as strain. At step 305, in some embodiments, probe 160 generates a magnetic field based on the signal generated from signal generator 140 in step 303. Probe 160 may generate a magnetic field using coil 161 and stylus 162, as described above. The magnetic field is generated such that when it reaches strain gauges 132 and 134, strain gauges 132 and 134 receive the magnetic field and detect it as a strain measurement.

At step 307, in some embodiments, it is determined whether strain gauges 132 and 134 have multiple legs. For example, strain gauge 132 may be a rosette strain gauge comprising three different legs. As another example, strain gauge 134 may be a single axial strain gauge with only one leg. If at step 307, method 300 determines that strain gauge 132 has multiple legs, method 300 continues to steps 319 through 329 to test whether the legs are correctly wired, patched, and oriented. If at step 307 method 300 determines that strain gauge 134 does not have multiple legs, method 300 continues to steps 309 through 317 to determine whether the single strain gauge is correctly wired.

If at step 307 system 100 determines strain gauge 134 does not have multiple legs, method 300 continues to step 309. At step 309, in some embodiments, probe 160 hovers across strain gauge 134. In some embodiments, probe 160 may start hovering at a first end or edge of strain gauge 134 and move across the width of strain gauge 134 until reaching a second end or edge of strain gauge 134. In some embodiments, probe 160 may hover back and forth between the first end and second end of strain gauge 134. By hovering across strain gauge 134, the magnetic field generated in step 305 emanates out of probe 160 and is sensed by strain gauge 134 as a voltage. Strain gauge 134 may receive the magnetic field from probe 160 as a voltage, and that voltage may excite strain gauge 134 as if it were being physically pressed or measuring strain on structure 130. Strain gauge 134 then interprets that excitement from the voltage as strain, and thus registers stimulus data as if it were measuring strain on structure 130. By exciting strain gauge 134 through a magnetic field and resultant voltage, a user or operator does not need to physically press on each strain gauge 134 to excite it and test its wiring. By hovering probe 160 over strain gauge 134, method 300 creates a non-invasive and quick way to test multiple strain gauges 132 affixed to structure 130. At step 311, in some embodiments, data acquisition component 120 receives stimulus data from strain gauge 134.

At step 313, in some embodiments, system 100 determines whether the stimulus data from step 311 is above a certain threshold. System 100 may have a threshold saved such that it could compare the stimulus data received to the threshold. For example, if data acquisition component 120 registers 20 microstrain on strain gauge 134 and the threshold is set to 15 microstrain, method 300 determines that the stimulus data is above the threshold. By determining whether the stimulus data is above a threshold, method 300 determines whether strain gauge 134 is properly connected to data acquisition component 120. By determining that it is properly connected, method 300 reduces the likelihood that data acquisition component 120 will receive faulty or inaccurate data when testing structure 130. If, at step 313, method 300 determines that this stimulus data is above the threshold, method 300 determines at step 313 that strain gauge 134 is operable. If, as probe 160 hovers across strain gauge 134 in step 309, the correct strain gauge registers the stimulus above a predetermined threshold then it is confirmed that strain gauge 134 is accurately measuring strain and connected to data acquisition component 120. If at step 313 method 300 determines the stimulus data is not above the predetermined threshold, then at step 317 method 300 determines that strain gauge 134 is not operable. For example, as probe 160 hovered across strain gauge 134, if data acquisition component 120 did not receive any stimulus data above the threshold, then there is an issue with strain gauge 134 and its wiring or capabilities may need to be checked. After steps 315 and/or 317, method 300 may end.

If, at step 307, method 300 determines that strain gauge 132 has multiple legs, method 300 continues to step 319. At step 319, probe 160 hovers across a first leg of strain gauge 132. In some embodiments, there may be a standard order in which to hover over each leg. For example, probe 160 may hover across leg A of the strain gauge 132 first when testing the orientation. By hovering across the first leg, method 300 determines whether the leg of strain gauge 132 registers the magnetic field as stimulus data that is above a certain threshold. In some embodiments, probe 160 hovers at the edge of strain gauge 132 and moves across the expected gauge leg. In some embodiments, steps 319, 321 and 323 can be performed using one or more of the techniques discussed above with respect to steps 309, 311 and 313, respectively.

At step 323, in some embodiments, method 300 determines whether the stimulus data received from the first leg is above a certain threshold. If at step 323 method 300 determines stimulus data is above a threshold on the correct leg of strain gauge 132, then it determines that the first leg may be wired or patched (e.g., connected to the data system) correctly at step 325. If at step 323 method 300 determines the stimulus data received from leg A is not above a threshold, method 300 determines the leg may be wired or patched incorrectly (e.g., has an incorrect orientation). In some embodiments, method 300 may flag strain gauge 132 and/or leg A of strain gauge 132 as needing additional checks and/or changes in its orientation.

At step 329, in some embodiments, method 300 determines whether strain gauge 132 had additional legs that need to be tested. If so, method 300 returns to step 319 and repeats steps 319 through 327 to determine whether the other legs are wired and patched correctly. Method 300 may repeat steps 319 through 327 until all legs of strain gauge 132 have been tested for their correct orientation. Once method 300 has tested all of the legs and there are no additional legs to test at step 329, method 300 may end. Method 300 may be repeated as many times as necessary to successfully test the wiring and orientation of all strain gauges 132 and 134 affixed to structure 130.

Modifications, additions, or omissions may be made to the methods described herein without departing from the scope of the invention. For example, the steps may be combined, modified, or deleted where appropriate, and additional steps may be added. For example, steps 319 through 327 may be omitted when strain gauge 134 does not have multiple legs. Additionally, the steps may be performed in any suitable order without departing from the scope of the present disclosure.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, functions, operations, or steps, any of these embodiments may include any combination or permutation of any of the components, elements, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

The invention claimed is:

1. A system, comprising:
   a signal generator configured to generate a signal, the signal ranging in frequency during a time period;
   a probe electrically coupled to the signal generator, the probe configured to hover across a strain gauge, the probe comprising:
      a coil configured to receive the signal from the signal generator and, based on the signal, generate a magnetic field; and
      a stylus coupled to the coil, the stylus configured to transmit the magnetic field to the strain gauge; and
   a data acquisition component coupled to the strain gauge, the data acquisition component configured to:
      receive stimulus data from the strain gauge, the stimulus data from the strain gauge resulting from the magnetic field transmitted by the probe;
      determine whether the stimulus data from the strain gauge is above a threshold; and
      in response to determining that the stimulus data from the strain gauge is above the threshold, determine that the strain gauge is operable.

2. The system of claim 1, the data acquisition component further configured to, in response to determining that the stimulus data from the strain gauge is not above the threshold, generate an alert that the strain gauge is not operable.

3. The system of claim 1, wherein the probe is further configured to hover from a first end of the strain gauge to a second end of the strain gauge and to hover from the second end of the strain gauge to the first end of the strain gauge.

4. The system of claim 1, wherein the magnetic field creates inductive coupling between the probe and the strain gauge and induces a signal into the strain gauge.

5. The system of claim 1, further comprising:
   a battery electrically coupled to the signal generator, and configured to provide power to the signal generator; and
   a housing structure housing the battery, the signal generator, and the probe.

6. The system of claim 1, further comprising:
   a first leg of the strain gauge, the first leg set at a first orientation;
   a second leg of the strain gauge, the second leg set at a second orientation;
   the probe further configured to:
      hover across the first leg of the strain gauge; and
      hover across the second leg of the strain gauge; and
   the data acquisition component further configured to:

receive stimulus data from the first leg;
determine whether the stimulus data from the first leg is above a first threshold;
in response to determining that the stimulus data from the first leg is above the first threshold, determine that the first leg is correctly oriented;
receive stimulus data from the second leg;
determine whether the stimulus data from the second leg is above a second threshold; and
in response to determining that the stimulus data from the second leg is above the second threshold, determine that the second leg is correctly oriented.

7. The system of claim 6, wherein the data acquisition component is further configured to:
in response to determining that the stimulus data from the first leg is not above the first threshold, generate an alert that the first leg is not correctly oriented; and
in response to determining that the stimulus data from the second leg is not above the second threshold, generate an alert that the second leg is not correctly oriented.

8. A method, comprising:
electrically coupling a signal generator to a probe, the probe comprising a coil and a stylus;
generating a signal by the signal generator, the signal ranging in frequency during a time period;
receiving the signal at the coil of the probe;
hovering the probe across the strain gauge;
transmitting, by the stylus of the probe, a magnetic field to the strain gauge;
receiving stimulus data from the strain gauge at a data acquisition component, the stimulus data from the strain gauge resulting from the magnetic field transmitted by the probe;
determining whether the stimulus data from the strain gauge is above a threshold; and
in response to determining the stimulus data from the strain gauge is above a threshold, determining that the strain gauge is operable.

9. The method of claim 8, further comprising in response to determining that the stimulus data from the strain gauge is not above the threshold, generating an alert that the strain gauge is not operable.

10. The method of claim 8, further comprising hovering the probe from a first end of the strain gauge to a second end of the strain gauge and to hover from the second end of the strain gauge to the first end of the strain gauge.

11. The method of claim 8, wherein the magnetic field creates inductive coupling between the probe and the strain gauge and induces a signal into the strain gauge.

12. The method of claim 8, further comprising:
electrically coupling a battery to the signal generator, the battery configured to provide power to the signal generator; and
housing the battery, the signal generator, and the probe in a housing structure.

13. The method of claim 8, further comprising:
hovering the probe across a first leg of the strain gauge, the first leg set at a first orientation;
hovering the probe across a second leg of the strain gauge, the second leg set at a second orientation;
receiving stimulus data from the first leg;
determining whether the stimulus data from the first leg is above a first threshold;
in response to determining that the stimulus data from the first leg is above the first threshold, determining that the first leg is correctly oriented;
receiving stimulus data from the second leg;
determining whether the stimulus data from the second leg is above a second threshold; and
in response to determining that the stimulus data from the second leg is above the second threshold, determining that the second leg is correctly oriented.

14. The method of claim 13, further comprising:
in response to determining that the stimulus data from the first leg is not above the first threshold, generating an alert that the first leg is not correctly oriented; and
in response to determining that the stimulus data from the second leg is not above the second threshold, generating an alert that the second leg is not correctly oriented.

15. A system, comprising:
a housing structure configured to house:
a signal generator configured to generate a signal, the signal ranging in frequency during a time period;
a battery, the battery electrically coupled to the signal generator and configured to provide power to the signal generator; and
a probe electrically coupled to the signal generator, the probe configured to hover across a strain gauge, the probe comprising:
a coil, the coil configured to receive the signal from the signal generator and, based on the signal, generate a magnetic field;
a stylus coupled to the coil, the stylus configured to transmit the magnetic field to the strain gauge; and
wherein the magnetic field creates inductive coupling between the probe and the strain gauge and induces a signal into the strain gauge.

16. The system of claim 15, further comprising:
a data acquisition component coupled to the strain gauge, the data acquisition component configured to:
receive stimulus data from the strain gauge, the stimulus data from the strain gauge resulting from the magnetic field transmitted by the probe;
determine whether the stimulus data from the strain gauge is above a threshold; and
in response to determining that the stimulus data from the strain gauge is above the threshold, determine that the strain gauge is operable.

17. The system of claim 15, the data acquisition component further operable to, in response to determining that the stimulus data from the strain gauge is not above the threshold, generate an alert that the strain gauge is not operable.

18. The system of claim 15, wherein the probe is further configured to hover from a first end of the strain gauge to a second end of the strain gauge and to hover from the second end of the strain gauge to the first end of the strain gauge.

19. The system of claim 15, further comprising:
a first leg of the strain gauge, the first leg set at a first orientation;
a second leg of the strain gauge, the second leg set at a second orientation;
the probe further configured to:
hover across the first leg of the strain gauge; and
hover across the second leg of the strain gauge; and
the data acquisition component further configured to:
receive stimulus data from the first leg;
determine whether the stimulus data from the first leg is above a first threshold; and
in response to determining that the stimulus data from the first leg is above the first threshold determine that the first leg is correctly oriented;
receive stimulus data from the second leg;
determine whether the stimulus data from the second leg is above a second threshold; and in response to determining that the stimulus data from the second leg is above the second threshold, determine that the second leg is correctly oriented.

\* \* \* \* \*